United States Patent
Andersen et al.

(10) Patent No.: US 6,741,123 B1
(45) Date of Patent: May 25, 2004

(54) DELTA-SIGMA AMPLIFIERS WITH OUTPUT STAGE SUPPLY VOLTAGE VARIATION COMPENSATION AND METHODS AND DIGITAL AMPLIFIER SYSTEMS USING THE SAME

(75) Inventors: Jack Andersen, Austin, TX (US); John Laurence Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 10/329,852

(22) Filed: Dec. 26, 2002

(51) Int. Cl.[7] .................................................. H03F 3/38
(52) U.S. Cl. ........................ 330/10; 375/238; 341/143
(58) Field of Search ...................... 330/10, 251, 207 A; 375/238; 341/143

(56) References Cited

U.S. PATENT DOCUMENTS 5,304,902 A * 4/1994 Ueki .......................... 318/254
5,754,943 A * 5/1998 Arai et al. ..................... 455/14
6,414,614 B1 * 7/2002 Melanson .................... 341/143

* cited by examiner

*Primary Examiner*—Henry Choe
(74) *Attorney, Agent, or Firm*—James J. Murphy; Winstead Sechrest & Minick P.C.

(57) ABSTRACT

A delta-sigma modulator for driving an output stage is disclosed. The delta-sigma modulator operates between first and second voltages and includes a loop filter, a quantizer, and a feedback loop coupling an output of the quantizer and an input of the loop filter. The feedback loop includes compensation circuitry for compensating for variations in the first and second voltages in response to a measured average of the first and second voltages and a measured difference between the first and second voltages. Measuring circuitry measures the average and the difference of the first and second voltages.

8 Claims, 5 Drawing Sheets

DELTA-SIGMA AMPLIFIERS WITH OUTPUT STAGE SUPPLY VOLTAGE VARIATION COMPENSATION AND METHODS AND DIGITAL AMPLIFIER SYSTEMS USING THE SAME

FIELD OF INVENTION

The present invention relates in general to digital amplifiers, and in particular, to delta-sigma amplifiers with supply voltage variation compensation and methods and digital amplifier systems using the same.

BACKGROUND OF INVENTION

Delta-sigma modulators (noise shapers) are particularly useful in digital to analog and analog to digital converters (DACs and ADCs). Using oversampling, a delta-sigma modulator spreads quantization noise power across the oversampling frequency band, which is typically much greater than the input signal bandwidth. Additionally, a delta sigma modulator performs noise shaping by acting as a lowpass filter to the input signal and a highpass filter to the noise; most of the quantization noise power is thereby shifted out of the signal band.

In addition to data conversion applications, delta-sigma noise shapers are increasingly utilized in the design of digital amplifiers. In one particular technique, a digital delta-sigma noise shaper provides a noise shaped (quantized) digital data stream to a pulse width (duty cycle) modulator PWM, which in turn drives a linear amplifier output stage and associated load. This technique is generally described in U.S. Pat. No. 5,784,017 entitled "Analogue and Digital Convertors Using Pulse Edge Modulators with Non-linearity Error Correction" granted Jul. 21, 1998 and U.S. Pat. No. 5,548,286 entitled "Analogue and Digital Convertor Using Pulse Edge Modulators with Non-linearity Error Correction" granted Aug. 20, 1996, both to Craven, U.S. Pat. No. 5,815,102 entitled "Delta Sigma PWM DAC to Reduce Switching" granted Sep. 29, 1998 to the present inventor (incorporated herein by reference), U.S. patent application Ser. No. 09/163,235 to the present inventor (incorporated herein by reference), and International Patent Application. No. PCT/DK97/00133 by Risbo.

One difficulty in implementing these digital amplifiers is minimizing noise and distortion due to power supply noise and variations. This problem is correctly identified in U.S. Pat. No. 5,559,467 to Smedly ("the '467 patent"). Specifically, the '467 patent recognizes the need to account for the time-varying value of the power supply voltage during modulation; however, the solution proposed in the '467 patent introduces its own distortion into the system.

Hence, improved circuits and methods are required for minimizing noise and distortion in digital amplifiers in light of power supply noise and time variations.

SUMMARY OF INVENTION

The principles of the present invention allow for the measurement of the sum and difference between the supply voltages supplying an amplifier output stage. The measured sum and difference are then utilized by a noise shaper driving the input to the output stage to compensate for variations in the supply voltages. When applied to ADC circuits and systems, these principles advantageously provide an output signal which is less sensitive to power supply noise and variations.

According to one particular embodiment, a delta-sigma modulator is disclosed for driving an output stage operating between first and second voltages including a loop filter, a quantizer, and a feedback loop coupling an output of the quantizer and an input of the loop filter. The feedback loop includes compensation circuitry for compensating for variations in the first and second voltages in response to a measured average of the first and second voltages and a measured difference between the first and second voltages. Measuring circuitry measures the average and the difference of the first and second voltages.

Advantageously, the principles of the present invention allow for amplifier supply voltage variations to be corrected in the noise shaper stage without introducing other noise and distortion into the amplifier output signal. These principles are particularly useful in digital amplifiers, such as digital audio amplifiers, and are applicable to a number of different amplifier output stages including half-bridge and full-bridge configurations. The output stages may be directly driven by the output of the noise shaper or through an intermediate stage such as a PWM converter.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
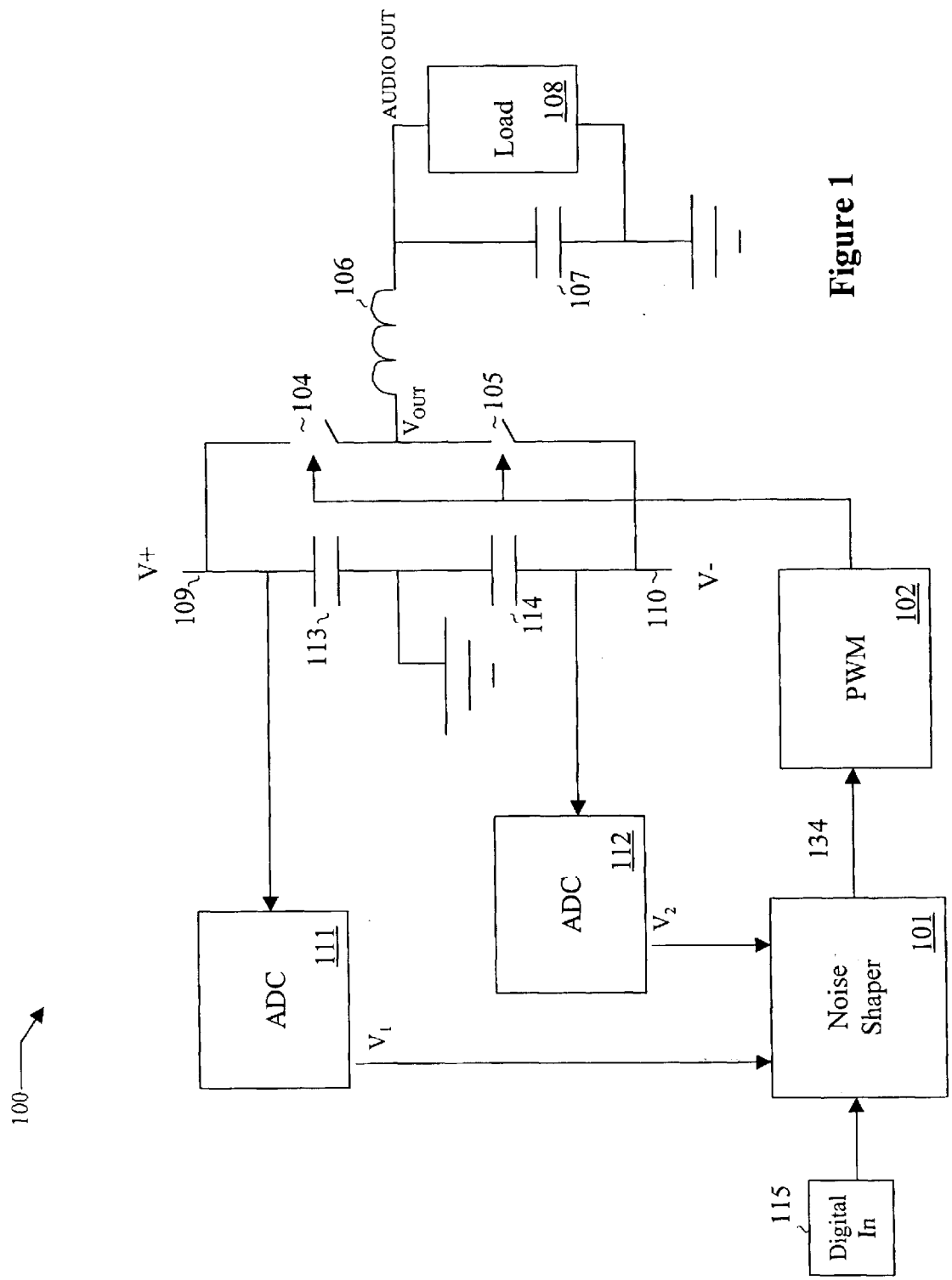
FIG. 1 is a block diagram of an exemplary audio amplifier embodying the principles of the present invention.

The principles of the present invention and their advantages are best understood by referring to the illustrated embodiment depicted in FIGS. 1–3 of the drawings, in which like numbers designate like parts.

FIG. 1 is block diagram of an exemplary audio amplifier 100 embodying the principles of the present invention. Audio amplifier is described in further detail in coassigned U.S. Pat. No. 6,344,811, issued Feb. 5, 2002 to Melanson for "Power Supply Compensation For Noise Shaped Digital Amplifiers," incorporated herein by reference.

Audio amplifier 100 includes a delta-sigma modulator (noise shaper) 101, which shifts noise in the audio baseband of the input signal DIGITAL IN to higher frequencies using oversampling and quantization. Delta-sigma modulator 101 preferably utilizes non-linear feedback for addressing variable moments in the following pulse width (duty cycle) modulated signal discussed below. Examples of delta-sigma modulators with such non-linear feedback are described in coassigned U.S. Pat. No. 6,150,969 to Melanson, entitled Correction of Nonlinear Output Distortion In a Delta Sigma DAC, and U.S. Pat. No. 5,815,102 to Melanson, entitled Delta Sigma PWM DAC to Reduce Switching, both of which are also incorporated herein by reference. A general discussion of delta-sigma modulator topologies is found in publications such as Norsworthy et al., Delta-Sigma Data Converters, Theory, Design and Simulation, IEEE Press, 1996.

A pulse-width modulator (PWM) stage 102 converts each quantized sample from delta-sigma modulator (noise shaper) 101 into a pulse width (duty-cycle) modulated pattern of logical ones and logic zeros of corresponding percentages of a total number of time slots in the pattern. The PWM stream output from pulse width modulator stage 102 in turn controls a pair of complementary switches 104 and 105, such as power transistors, which in the illustrated embodiment form a half-bridge between voltage supply rails 109 and 110. In particular, switch 104 drives the unfiltered analog output $V_{OUT}$ to voltage V+ during logic high slots of each PWM pattern, and switch 105 drives the output $V_{OUT}$ to V– during the logic low slots of the pattern. In alternate embodiments, a full-bridge output or capacitor-coupled output may be used in which the output operates from a single voltage supply or rail. In additional alternate embodiments, in which a single-bit noise shaper 101 is utilized, the output stream from delta-sigma modulator 101 may directly control switches 104 and 105.

The unfiltered analog audio signal $V_{OUT}$ generated by switches 104 and 105 is passed through an L-C filter including an inductor 106 and capacitor 107 which removes the high frequency (out-of-band) energy components. The ultimate filtered audio output signal AUDIO OUT drives a load 108, such as an audio speaker or headset.

Switches 104 and 105 generate the unfiltered audio signal $V_{OUT}$ by driving the output $V_{OUT}$ from corresponding voltage rails 109 and 110 at respective nominal supply voltages V+ and V–. Generally, voltage rails 109 and 110 are sourced from unregulated power-supplies (not shown) and consequently the voltages V+ and V– typically vary with time.

ADCs 111 and 112 respectively monitor voltage rails 109 and 110 and provide corresponding scaled digital representations $V_1$ and $V_2$ of the voltages V+ and V– to delta-sigma modulator 102. Delta-sigma modulator 102 utilizes the outputs of ADCs 111 and 112 to correct for variations and noise in voltages V+ and V–, as described below. High frequency energy on voltage rails 109 and 110 is coupled to ground through capacitors 113 and 114.

For purposes of discussion, an audio application is described as an operation performed on digital audio from a source (e.g., Digital In signal 115) such as a compact disk (CD) or digital versatile disk (DVD) player; however, the concepts described herein are utilized in a wide range of amplifier and data conversion applications, including digital motor controls and Class D power supplies.

Figure 2A:
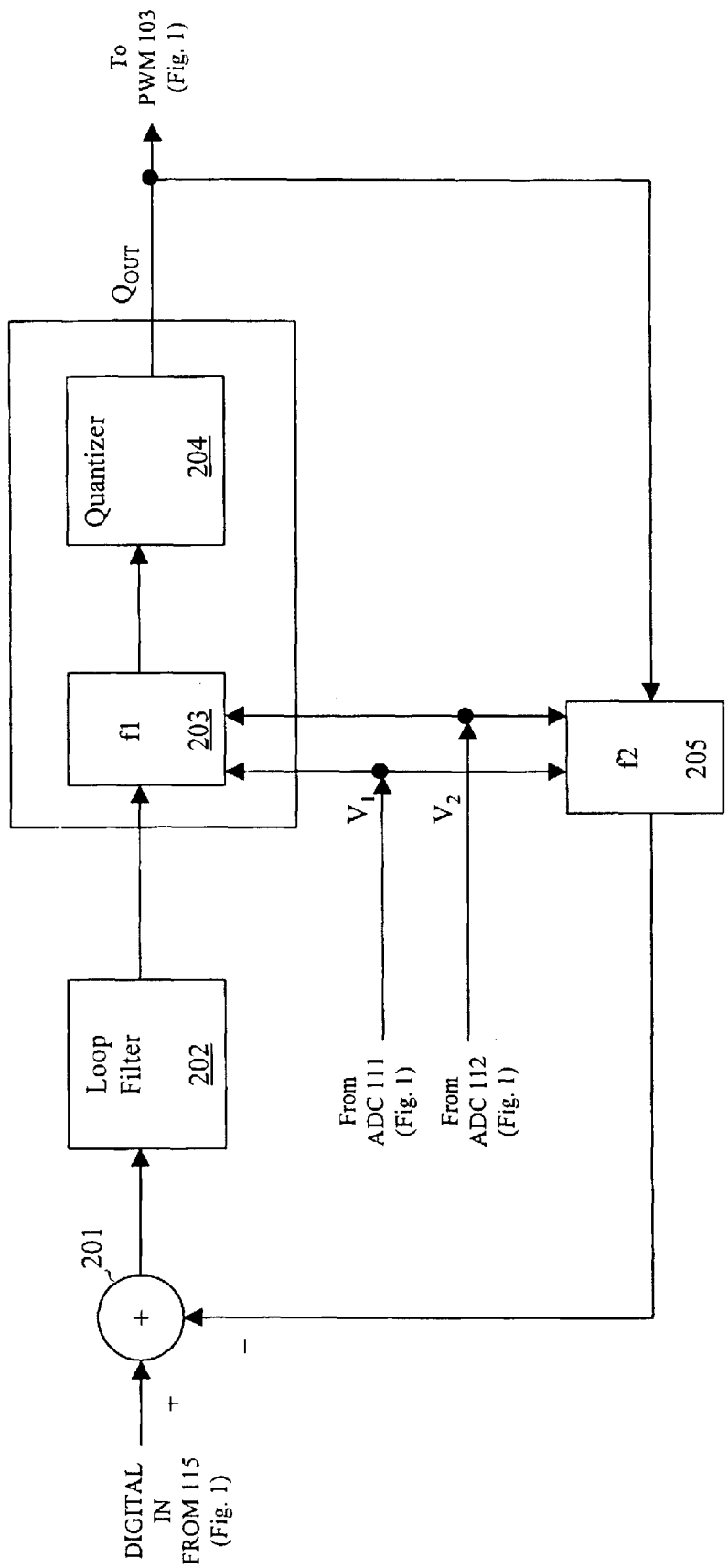
FIG. 2A is a block diagram illustrating the exemplary noise shaper of FIG. 1 in further detail.

FIG. 2A is a block diagram illustrating an exemplary embodiment of delta-sigma modulator 102 in further detail. The digital audio input signal, DIGITAL IN signal 115, is summed with negative feedback from the delta-sigma loop by input summer 201 and the resulting sum passed through a conventional digital loop filter 202. The output from loop filter 202 drives a feed-forward compensation block f1 (203), which receives digital supply rail voltage variation compensation data V1 and V2 from ADCs 111 and 112 of FIG. 1 and in turn provides a compensated input to digital quantizer 204. The delta-sigma feedback loop between the output of quantizer 204 and the inverting input of input summer 201 similarly includes a compensation block f2 (205) receiving digital supply rail voltage variation compensation data V1 and V2 from ADCs 111 and 112.

Each quantized sample $Q_{OUT}$ from quantizer 204 represents a corresponding PWM pattern of N number of total time slots with an active (logic high) pulse width of W number of time slots, in which N is an integer greater than two (2) and W is an integer from 0 to N. Hence, for a given quantized sample from quantizer 204, the resulting PWM pattern from PWM stage 103 of FIG. 1 generates an output voltage $V_{OUT}$ through switches 113 and 114 at the voltage V+ for W/N number of time slots and at the voltage of V– for (N–W)/N time slots such that:

$$V_{OUT}=(V+)*W/N+(V-)*(N-W)/N=((V+)-(V-))*W/N+(V-) \quad (1)$$

If the numerical values of the digital input samples of DIGITAL IN signal 115 are scaled in units of volts, then the numerical values V1 and V2 of voltages V+ and V– generated by ADCs 111 and 112 are automatically, property scaled with respects to the numerical values of DIGITAL IN signal 115. In general, however, this automatic and proper scaling does not necessarily occur. For example, in the illustrated embodiment, a signed numerical input for DIGITAL IN signal 115 with a range from –1 to 1 results in output PWM pattern with an active pulse duty cycle ranging from 0% to 100%. In other words, a signed numerical input at DIGITAL IN signal 115 of –1 maps to 0% duty cycle (i.e. W=0), a signed numerical input of +1 maps to 100% duty cycle (i.e. W=N), and numerical input of 0 maps to 50% duty cycle (i.e. W=N/2). Therefore ADCs 111 and 112 convert the analog voltages V+ and V– and corresponding scaled output voltages V1 and V2 consistent with the scaling of DIGITAL IN signal 115. In the illustrated embodiment, the resulting pulse width of the active high slots for each PWM pattern output from PWM stage 103 in response to each quantized sample from delta-sigma modulator 102 is therefore:

$$W=N*(1+Q_{OUT})/2. \quad (2)$$

Feedback compensation block f2 205 of FIG. 2A provides feedback to modulator input summer 201. Specifically, block f2 calculates the actual average voltage observed at the output $V_{OUT}$, given scaled digital power supply voltages V1 and V2 and input DIGITAL IN:

$$f2_{OUT}=(V1-V2)*W/N+V2=Q_{OUT}*(V1-V2)/2+(V1+V2)/2, \quad (3)$$

in which $Q_{OUT}$ is again the quantized (truncated) digital output from quantizer 204.

Feedforward compensation block f1 generates the inverse of feedback compensation block f2. In other words, for a given sample output $Q_{OUT}$ from delta-sigma modulator 102 corresponding to an output voltage x at the output $V_{OUT}$:

$$f1_{OUT}=(x-(V1+V2)/2)*2/(V1-V2). \quad (4)$$

Figure 2B:
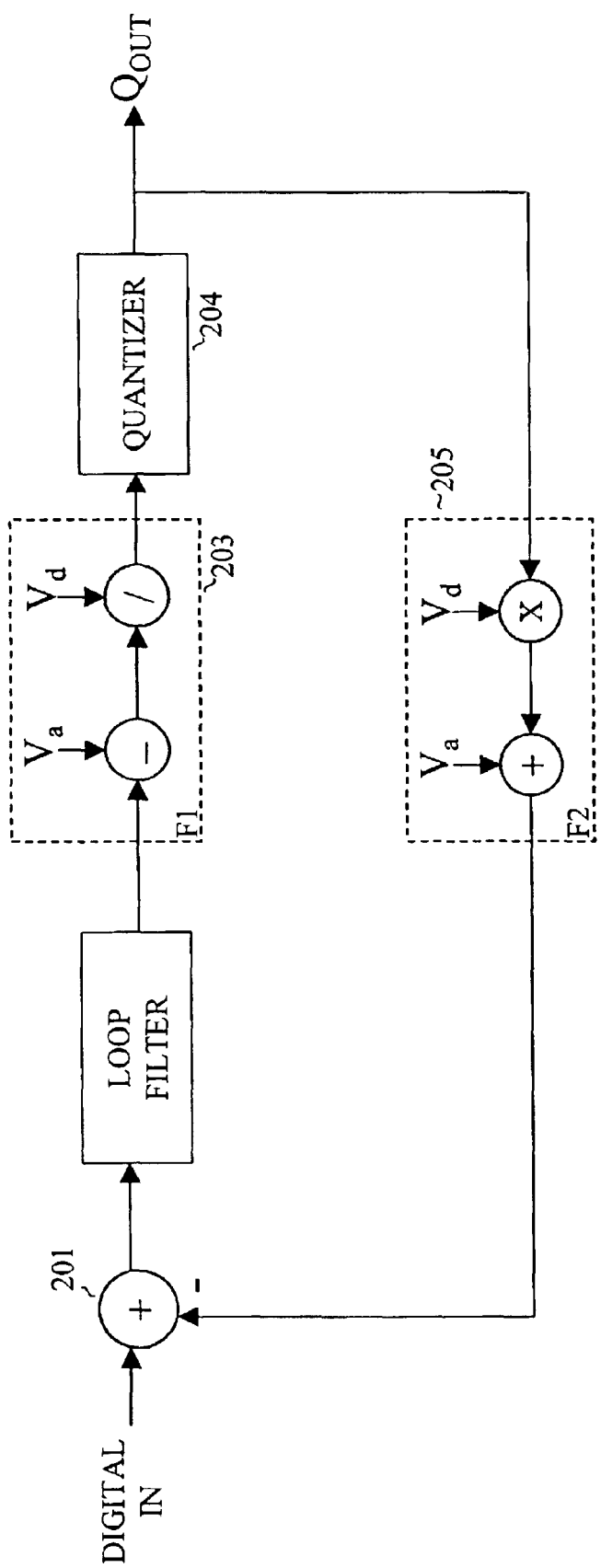
FIG. 2B graphically illustrates operation of the f1 and f2 voltage compensation blocks of the exemplary noise shaper of FIG. 2A.

FIG. 2B graphically illustrates operation of f1 and f2 blocks 203 and 205 for the illustrated embodiment in which $V_a=(V1+V2)/2$ and $V_d=(V1-V2)/2$. FIG. 2B and Equations (3) and (4) demonstrate that the scaled supply voltage difference noise $V_d=(V1-V2)/2$ couples to the input DIGITAL IN signal 115 through input summer 201 as a gain error applied to the quantizer output $Q_{Out}$. Consequently, variations in difference noise $V_d$ modulate or scale the input signal, DIGITAL IN signal 115, in a signal-dependent a manner analogous to distortion. This "distortion" occurs over a wide signal band as variations in difference noise $V_d$ modulate the wideband quantization noise in $Q_{Out}$ which folds back into the baseband. Offset in the measurement of difference noise $V_d$ is critical since an offset will lead to reduced noise rejection in $V_{OUT}$, although gain error is less critical since a gain error in $V_d$ only results in a gain error on the output signal $V_{OUT}$.

On the other hand, the average voltage noise $V_a=(v1+v2)/2$ couples to the output $V_{OUT}$, even without any signal present at the input DIGITAL IN signal 115, thereby directly adding to the noise floor in $V_{OUT}$. In the case of the average noise $V_a$, offset measurement is not critical, since offset in average noise $V_a$ only results in an offset at the output $V_{OUT}$; however, gain error in the measurement of noise $V_a$ is critical, since gain error in $V_a$ will result in reduced noise rejection.

The principles of the present invention provide for the scaled supply difference noise $V_d$ and the scaled average noise $V_a$ to be measured and filtered in separate ADCs 111 and 112. Advantageously, less lowpass filtering is required by the average noise $V_a$, which implies less latency and better rejection in a wider frequency range. Gain correction is then applied to average noise $V_a$ and offset correction is applied to difference noise $V_d$.

Figure 3A:
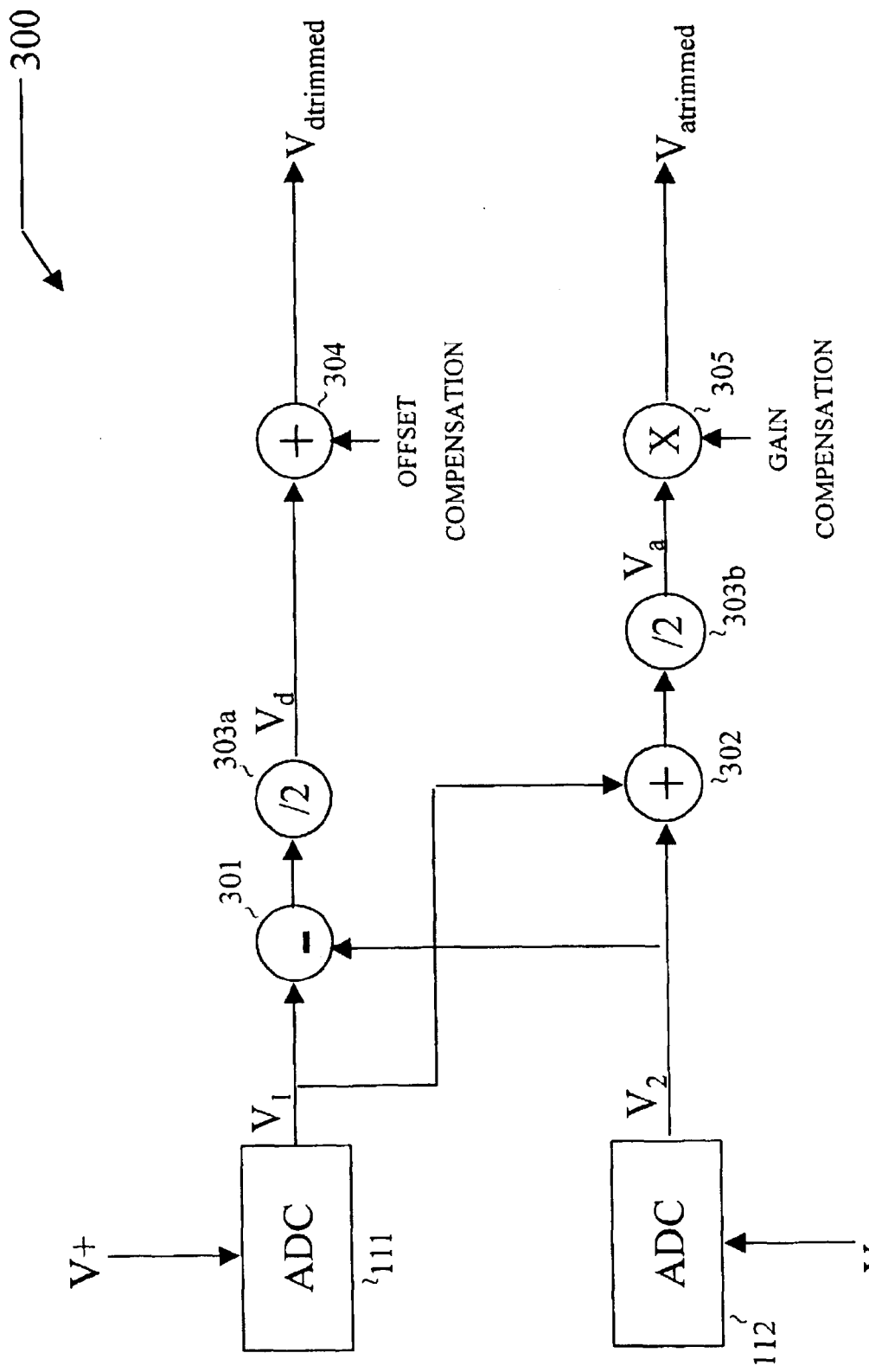
FIG. 3A illustrates representative gain and offset compensation circuitry suitable for compensating for supply voltage variations according to one embodiment of the principles of the present invention.

FIG. 3A illustrates gain and offset compensation circuitry 300 according to one embodiment of the principles of the present invention. In compensation circuitry 300, the difference between the scaled digital outputs V1 and V2 from ADCs 111 and 112 is taken by digital subtractor 301 and their sum taken by digital summer 302. The respective outputs of subtractor 301 and summer 302 are then divided by a constant two (2) in respective digital dividers 303a and 303b to obtain the digital values for difference noise $V_d$ and average noise $V_a$ without gain or offset correction.

With respect to difference noise $V_d$, offset compensation (trimming) is provided in the digital path by a scaling factor OFFSET COMPENSATION which is summed with the uncorrected noise $V_d$ in a digital summer 304 to generate $V_{dtrimmed}$. The value $V_{dtrimmed}$ is then provided to the $V_a$ and $V_d$ inputs to compensation blocks f1 and f2 of FIGS. 2A and 2B. The gain of the average noise $V_a$ is trimmed for gain error compensation digitally by multiplying the uncorrected average noise value $V_a$ with a gain compensation factor GAIN COMPENSATION in a digital multiplier 305. The value $V_{atrimmed}$ is similarly provided to compensation blocks f1 and f2. Preferred techniques for determining the values of OFFSET COMPENSATION and GAIN COMPENSATION are discussed below.

Figure 3B:
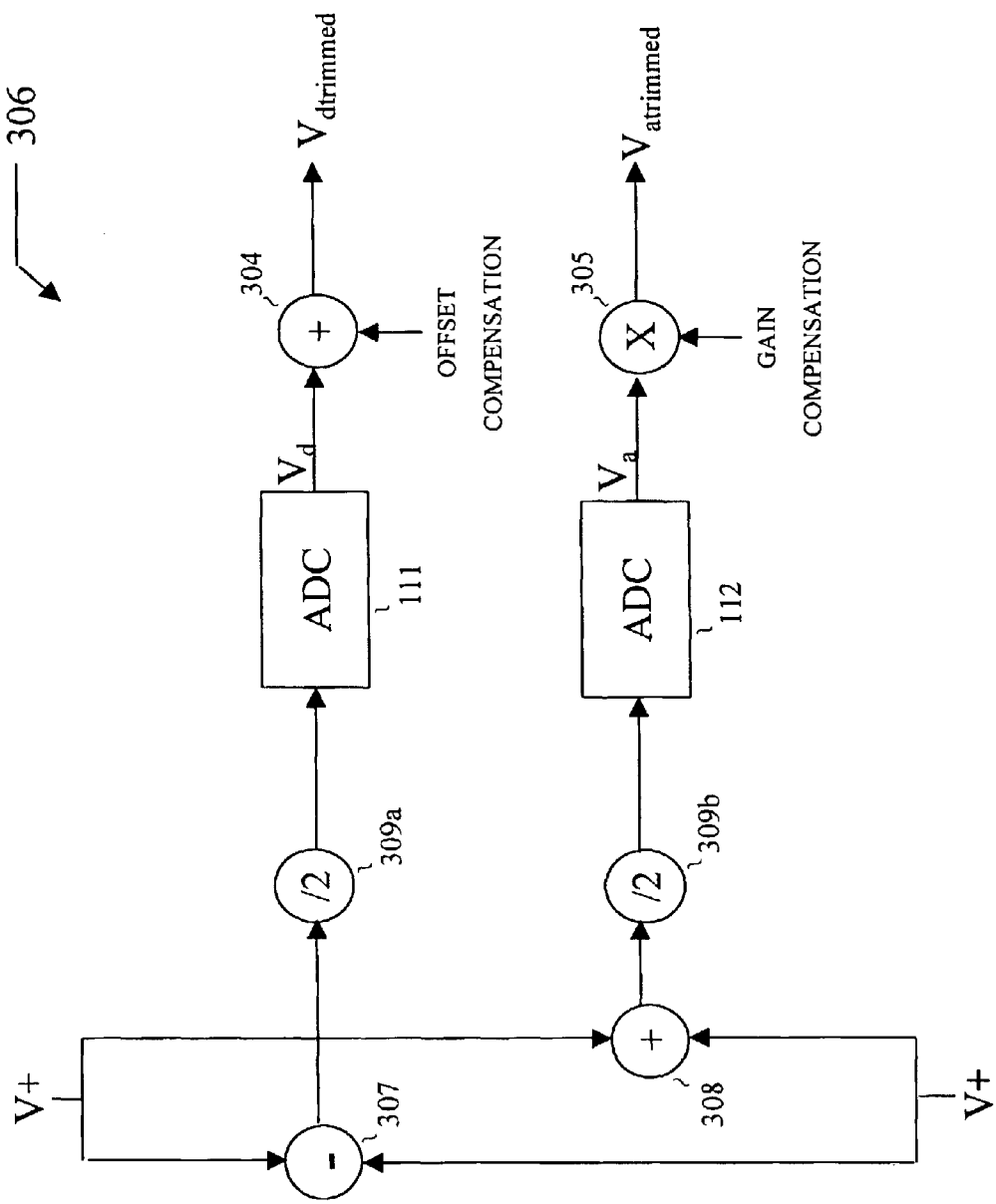
FIG. 3B illustrates representative gain and offset compensation circuitry suitable for compensating for supply voltage variations according to a second embodiment of the inventive principles.

Gain and offset compensation circuitry 306 according to a second embodiment of the inventive principles is shown in FIG. 3B. In this case, the voltage difference between analog voltage rails V+ and V− is taken by an analog subtractor 307 and the sum by an analog summer 308. The outputs from subtractor 307 and summer 308 are then divided by a constant of two (2) by respective dividers 309a and 309b and then filtered and converted by ADCs 111 and 112 to produce the uncompensated scaled digital values of $V_d$ and $V_a$. Offset and gain compensation factors OFFSET COMPENSATION and GAIN COMPENSATION are then applied by summer 304 and multiplier 305, as described above.

The value of the gain compensation scaling factor GAIN COMPENSATION is determined after production of audio amplifier 100 since the value depends on the matching of associated external circuitry such as external power supplies and filter elements. According to one embodiment of the inventive principles, the amplifier output voltage $V_{OUT}$ of FIG. 1 is measured for a given input DIGITAL_IN signal 115. Specifically, since the power supply rejection is best with the correct scaling factor GAIN COMPENSATION, the factor GAIN COMPENSATION is set by measuring the noise on the output signal AUDIO OUT (e.g. the difference from the expected output spectrum) and adjusting the gain scaling factor GAIN COMPENSATION until this noise is minimized. If a zero-value of DIGITAL IN signal 115 (silence) is utilized, then $V_d$ is proportional to whatever noise is present on the output. In sum, by setting GAIN COMPENSATION, the AC noise at $V_{OUT}$ is trimmed.

The value of the offset correction factor OFFSET COMPENSATION is also set after production of amplifier 100 since its value also depends on the matching of associated external circuitry. In one embodiment, the output voltage at output signal AUDIO OUT of amplifier 100 is measured and the noise on the output (difference from the expected output spectrum) observed. The value of OFFSET COMPENSATION is adjusted to trim the offset until this difference is minimized. In this case, the input to DIGITAL IN is a pure sine wave such that the output noise in AUDIO OUT is simply whatever noise is present on the output at frequencies other than the frequency of the input sine wave.

The noise present on the output AUDIO OUT depends on the noise present on the power supplies. The trimming is therefore improved by increasing the noise on the power supply rails V+ and V− for instance by controlling a power supply regulator, disabling a power supply pumping circuit, or any other way of adding a signal to the power supply rails. Additionally, adjusting the gain and offsets in the difference noise $V_d$ and average noise $V_a$ as described above may be part of product test at assembly, part of a user initiated calibration sequence, executed at startup of amplifier 100, or during amplifier operation. Furthermore, for a full-bridged output, the average noise is coupled to both speaker terminals and thus cancels automatically, and therefore for the difference power supply noise $V_d$ only needs to be measured and corrected.

Although the invention has been described with reference to a specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A delta-sigma modulator for driving an output stage operating between first and second voltages, comprising:

a loop filter;

a quantizer;

a feedback loop coupling in output of the quantizer and an input of the loop filter, the feedback loop including compensation circuitry for compensating for variations in the first and second voltages in response to a measured average of the first and second voltages and a measured difference between the first and second voltages; and measuring circuitry for measuring the average and the difference of the first and second voltages.

2. The delta-sigma modulator of claim 1, wherein the measuring circuitry comprises:
   first and second analog to digital converters for converting the first and second voltages to first and second digital voltages;
   a digital subtractor for taking the difference of the first and second digital voltages to generate a digital difference between the first and second voltages for utilization by the compensation circuitry; and
   digital averaging circuitry for taking the average of the first and second digital voltages to generate a digital average between the first and second voltages for italization by compensation circuitry.

3. The delta-sigma modulator of claim 1, wherein the measuring circuitry comprises:
   analog circuitry for taking the analog difference between the first and second voltages;
   analog circuitry for taking the analog average of the first and second voltages;
   a first analog to digital converter for converting the analog difference to a digital difference between the first and second voltages for utilization by the compensation circuitry; and
   a second analog to digital converter for converting the analog average to a digital average of the first and second voltages for utilization by the compensation circuitry.

4. The delta-sigma modulator of claim 1, further comprising gain compensation circuitry for applying a gain compensation factor to the measured average of the first and second voltages.

5. The delta-sigma modulator of claim 1, further comprising offset compensation circuitry for applying an offset compensation factor to the measured difference between the first and second voltages.

6. A digital amplifier, comprising:
   an output stage for driving a load between first and second voltages;
   a noise shaper for driving an input of the output stage and including compensation circuitry for compensating for variations in the first and second voltages in response to a measured average of the first and second voltages and a measured difference between the first and second voltages; and
   measuring circuitry for measuring the average and the difference of the first and second voltages.

7. The digital amplifier of claim 6, wherein the output stage comprises a pulse width modulator stage having an input driven by the output of the noise shaper.

8. The digital amplifier of claim 6, wherein the output stage comprises a half-bridge output driver operating between first and second voltage rails supplying the first and second voltages.

* * * * *

(12) EX PARTE REEXAMINATION CERTIFICATE (5666th)
United States Patent
Andersen et al.

(10) Number: US 6,741,123 C1
(45) Certificate Issued: Jan. 30, 2007

(54) DELTA-SIGMA AMPLIFIERS WITH OUTPUT STAGE SUPPLY VOLTAGE VARIATION COMPENSATION AND METHODS AND DIGITAL AMPLIFIER SYSTEMS USING THE SAME

(75) Inventors: Jack Andersen, Austin, TX (US); John Laurence Melanson, Austin, TX (US)

(73) Assignee: Cirrus Logic Inc., Austin, TX (US)

Reexamination Request:
No. 90/007,132, Jul. 26, 2004

Reexamination Certificate for:
Patent No.: 6,741,123
Issued: May 25, 2004
Appl. No.: 10/329,852
Filed: Dec. 26, 2002

(51) Int. Cl.
*H03F 3/38* (2006.01)

(52) U.S. Cl. .................... 330/10; 375/238; 341/143
(58) Field of Classification Search ............ None
See application file for complete search history.

(56) References Cited

U.S. PATENT DOCUMENTS

| | | |
|---|---|---|
| 5,548,286 A | 8/1996 | Craven |
| 5,559,467 A | 9/1996 | Smedley |
| 5,784,017 A | 7/1998 | Craven |
| 5,815,102 A | 9/1998 | Melanson |
| 6,150,969 A | 11/2000 | Melanson |
| 6,344,811 B1 | 2/2002 | Melanson |
| 6,414,614 B1 | 7/2002 | Melanson |

FOREIGN PATENT DOCUMENTS

WO  WO 97/374433  10/1997

*Primary Examiner*—Minh Nguyen

(57) ABSTRACT

A delta-sigma modulator for driving an output stage is disclosed. The delta-sigma modulator operates between first and second voltages and includes a loop filter, a quantizer, and a feedback loop coupling an output of the quantizer and an input of the loop filter. The feedback loop includes compensation circuitry for compensating for variations in the first and second voltages in response to a measured average of the first and second voltages and a measured difference between the first and second voltages. Measuring circuitry measures the average and the difference of the first and second voltages.

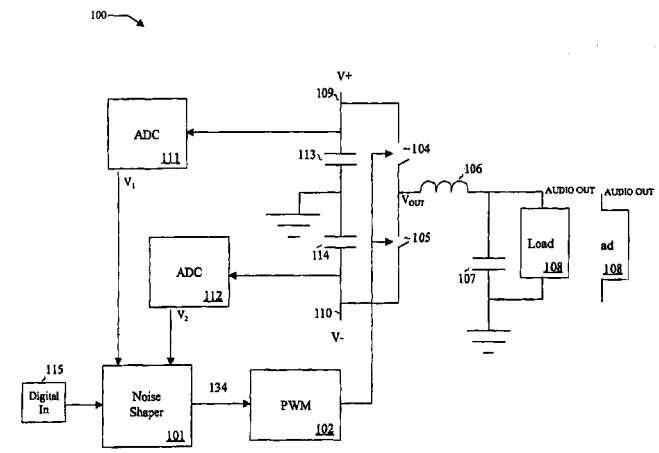

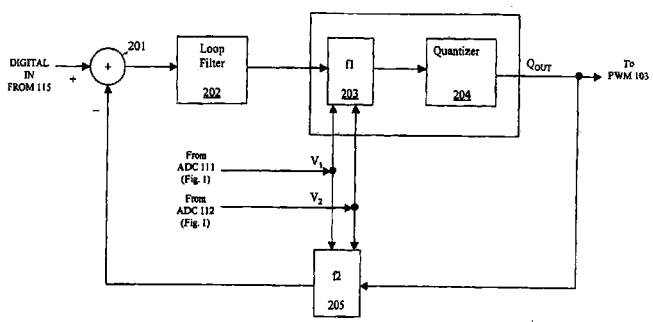

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–8 is confirmed.

* * * * *